(12) United States Patent
Bhavnagarwala

(10) Patent No.: US 6,515,893 B1
(45) Date of Patent: Feb. 4, 2003

(54) SOURCE PULSED, LOW VOLTAGE CMOS SRAM CELL FOR FAST, STABLE OPERATION

(75) Inventor: Azeez J. Bhavnagarwala, Atlanta, GA (US)

(73) Assignee: LSI Logic Corporation, Milpitas, CA (US)

( * ) Notice: Subject to any disclaimer, the term of this patent is extended or adjusted under 35 U.S.C. 154(b) by 102 days.

(21) Appl. No.: 09/820,577

(22) Filed: Mar. 28, 2001

(51) Int. Cl.[7] .............................................. G11C 11/00
(52) U.S. Cl. ................... 365/154; 365/203; 365/189.09
(58) Field of Search .................................. 365/154, 203, 365/189.09

(56) References Cited

U.S. PATENT DOCUMENTS

| | | | | |
|---|---|---|---|---|
| 5,689,468 A | * | 11/1997 | Ihara | 365/145 |
| 5,715,191 A | * | 2/1998 | Yamauchi et al. | 365/154 |
| 5,757,702 A | * | 5/1998 | Iwata et al. | 365/154 |
| 6,184,548 B1 | * | 2/2001 | Chi et al. | 257/301 |
| 6,229,753 B1 | * | 5/2001 | Kono et al. | 365/189.11 |
| 6,333,874 B2 | * | 12/2001 | Yamauchi | 365/154 |

* cited by examiner

Primary Examiner—Richard Elms
Assistant Examiner—VanThu Nguyen
(74) Attorney, Agent, or Firm—Fitch, Even, Tabin & Flannery

(57) ABSTRACT

A source pulsed complementary metal oxide semiconductor static random access memory offers higher cell stability, lower bit line delay, and lower standby power than previously available in low-voltage devices. A memory cell includes a first pull-up device, a first pull-down device connected to the first pull-up device, a first cell access device connected to the first pull-down device, a second pull-up device connected to the first pull-up device, a second pull-down device connected to the second pull-up device, and a second cell access device connected to the second pull-down device wherein the first cell access device and the second cell access device each have a gate connected to a word line that is driven to a voltage less than Vss except during cell access and is pulsed to Vdd during cell access.

8 Claims, 6 Drawing Sheets

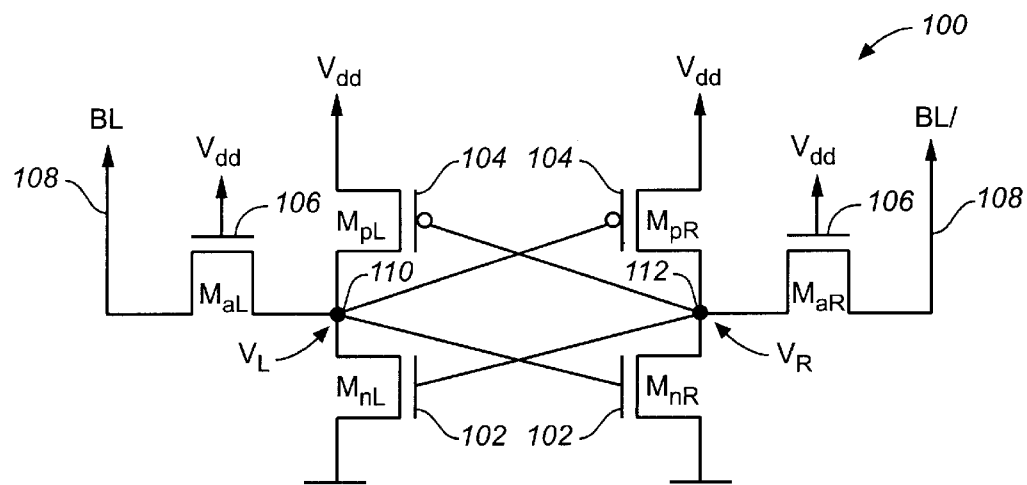
FIG._1
*(PRIOR ART)*
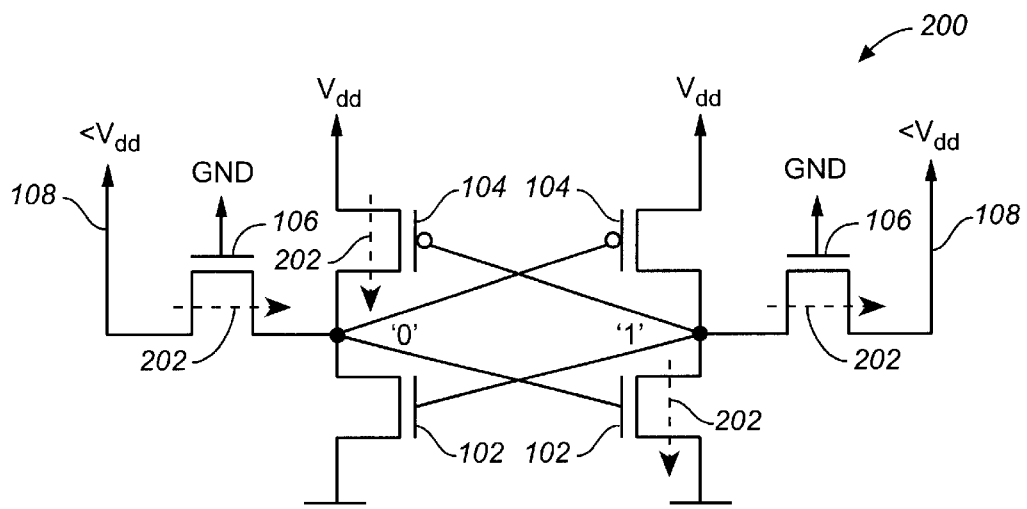
FIG._2
*(PRIOR ART)*

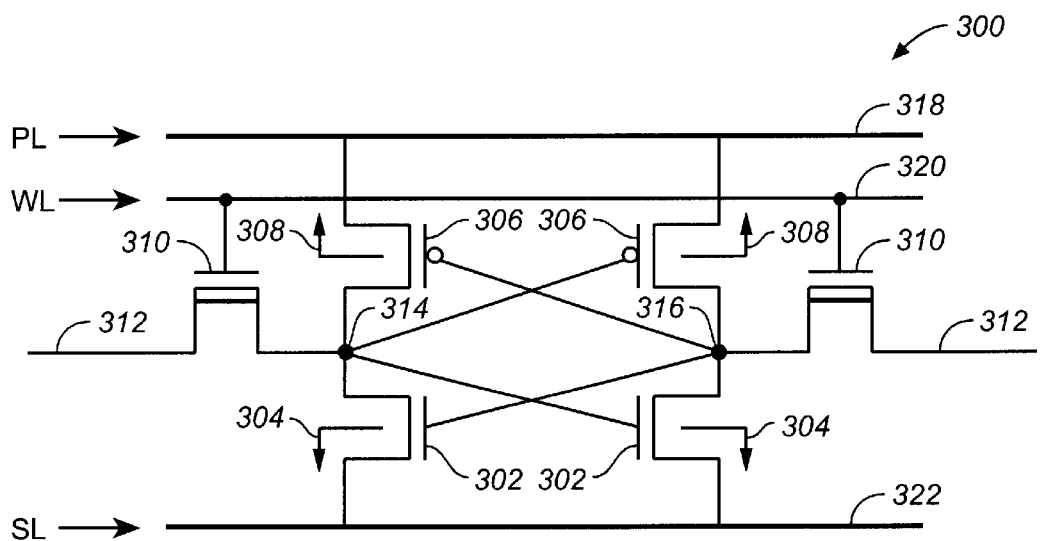
FIG._3
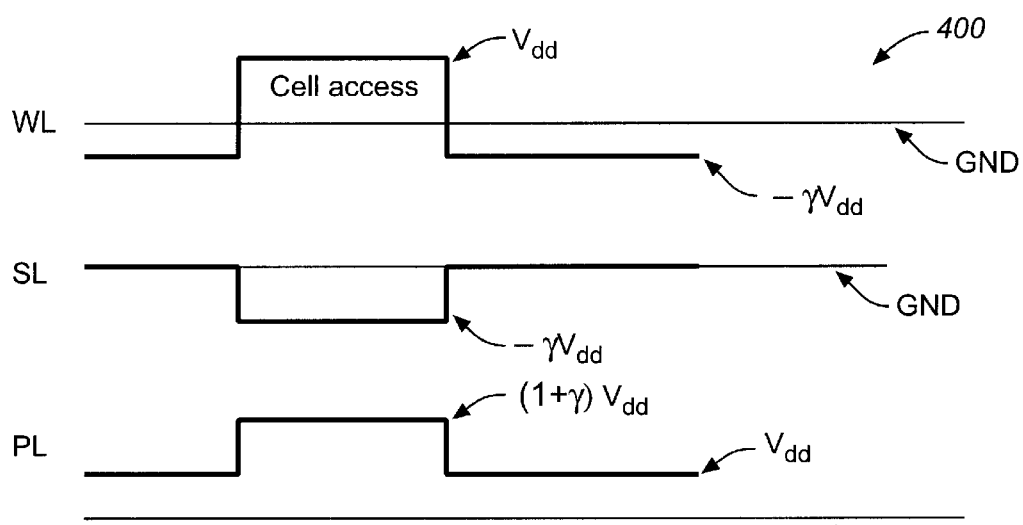
FIG._4

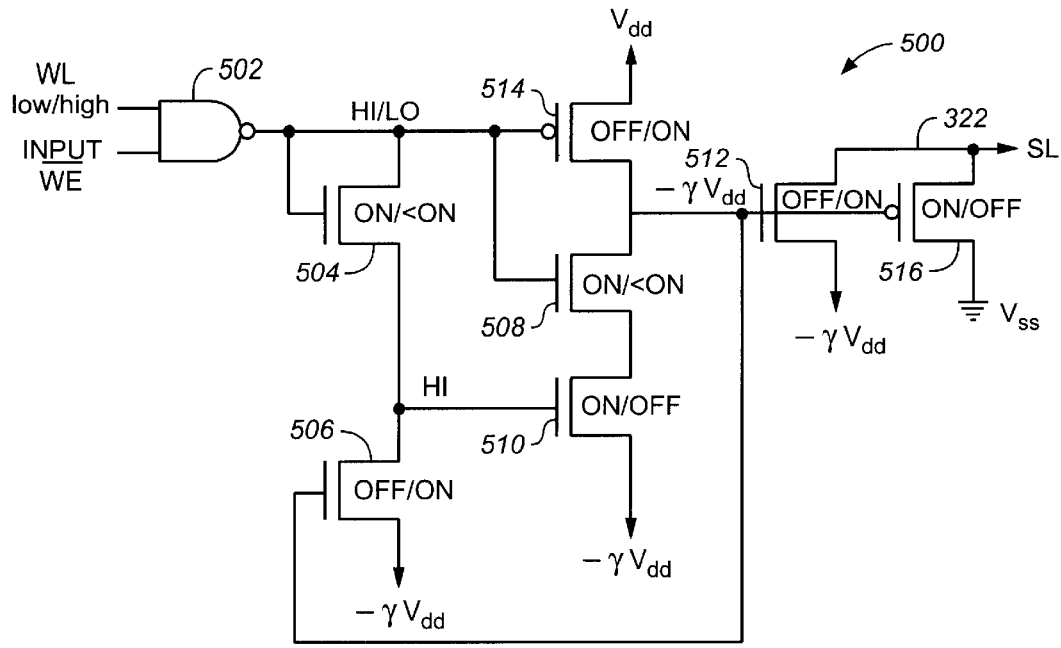
FIG._5
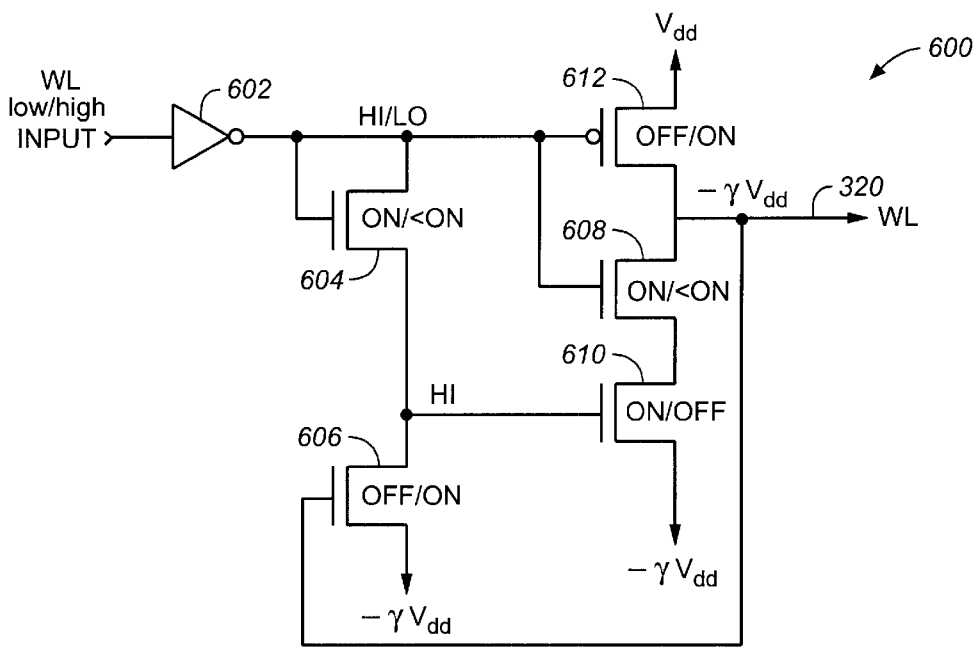
FIG._6

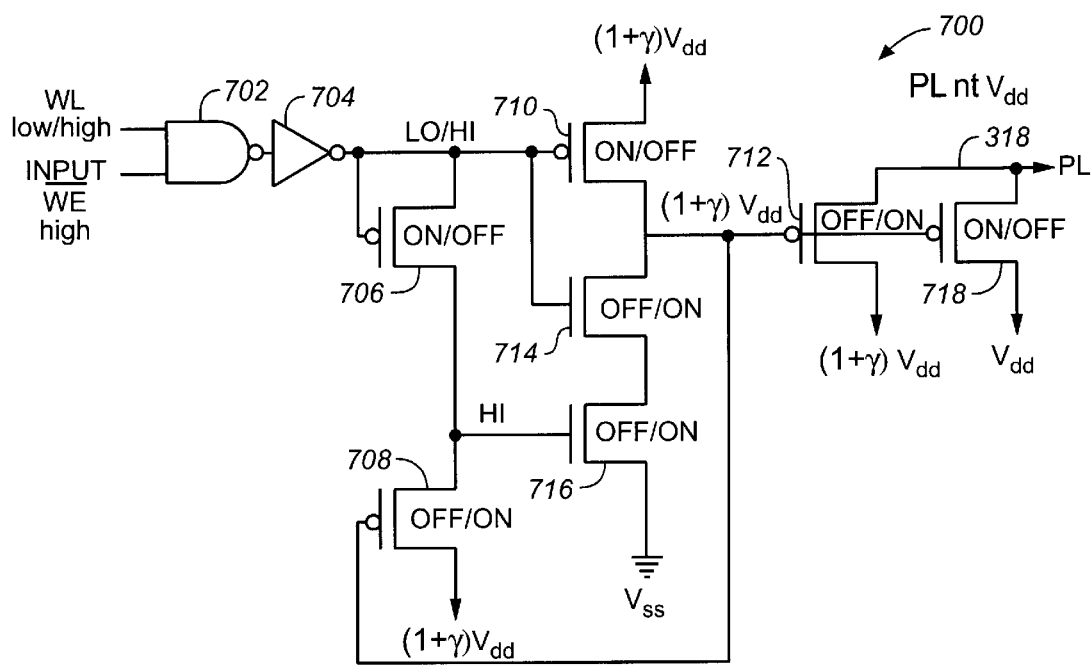
FIG._7
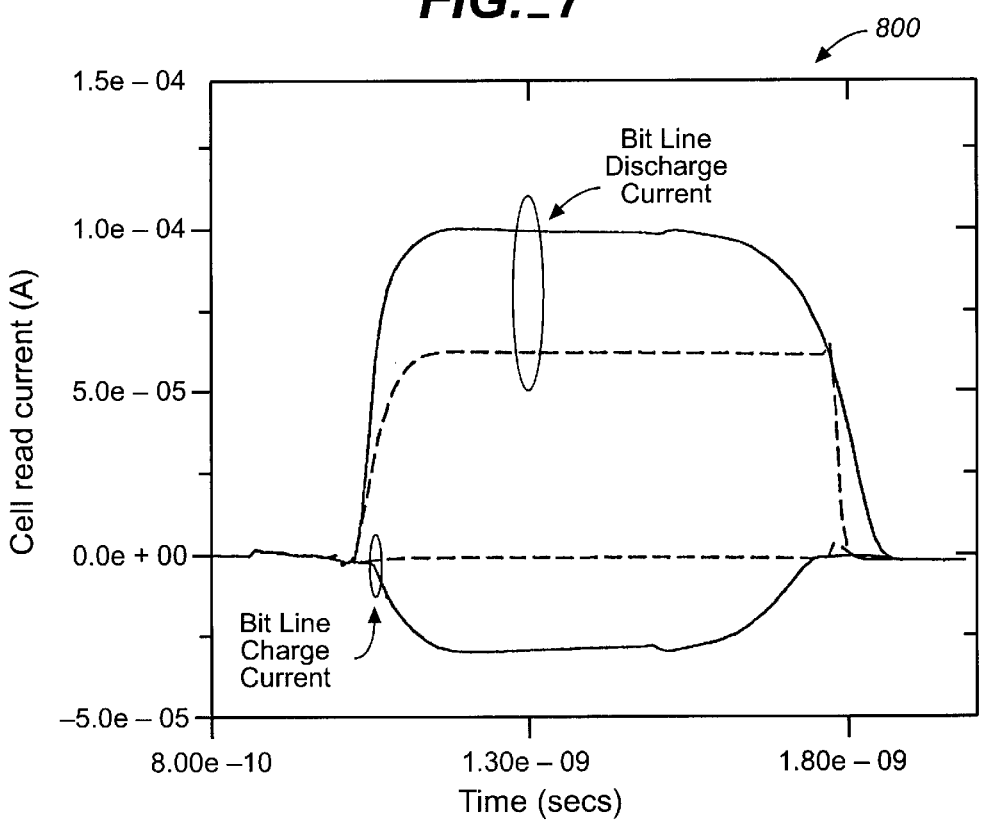
FIG._8

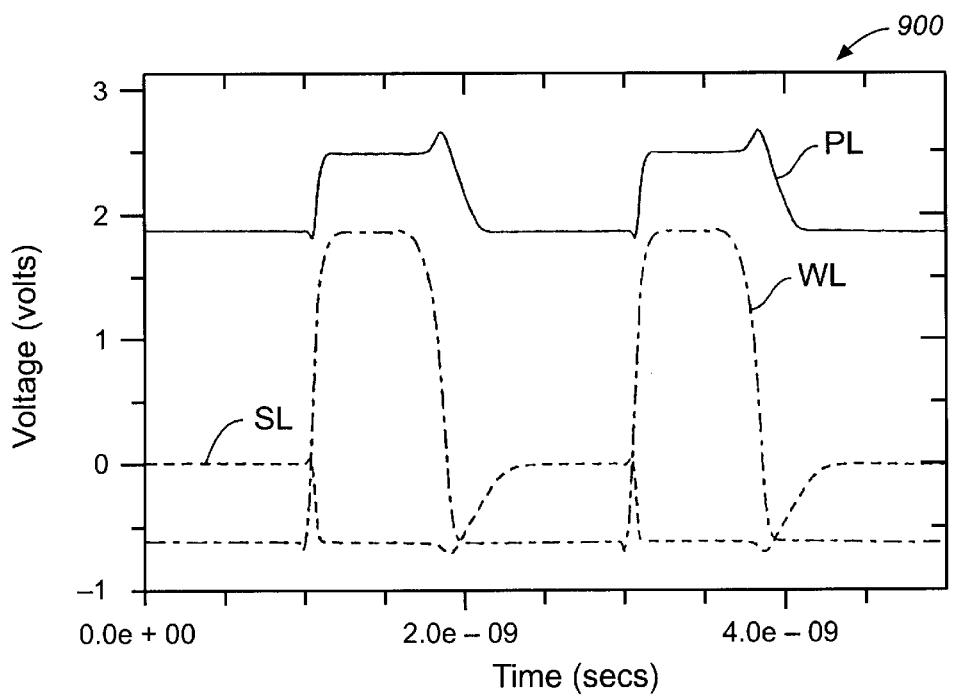
FIG._9
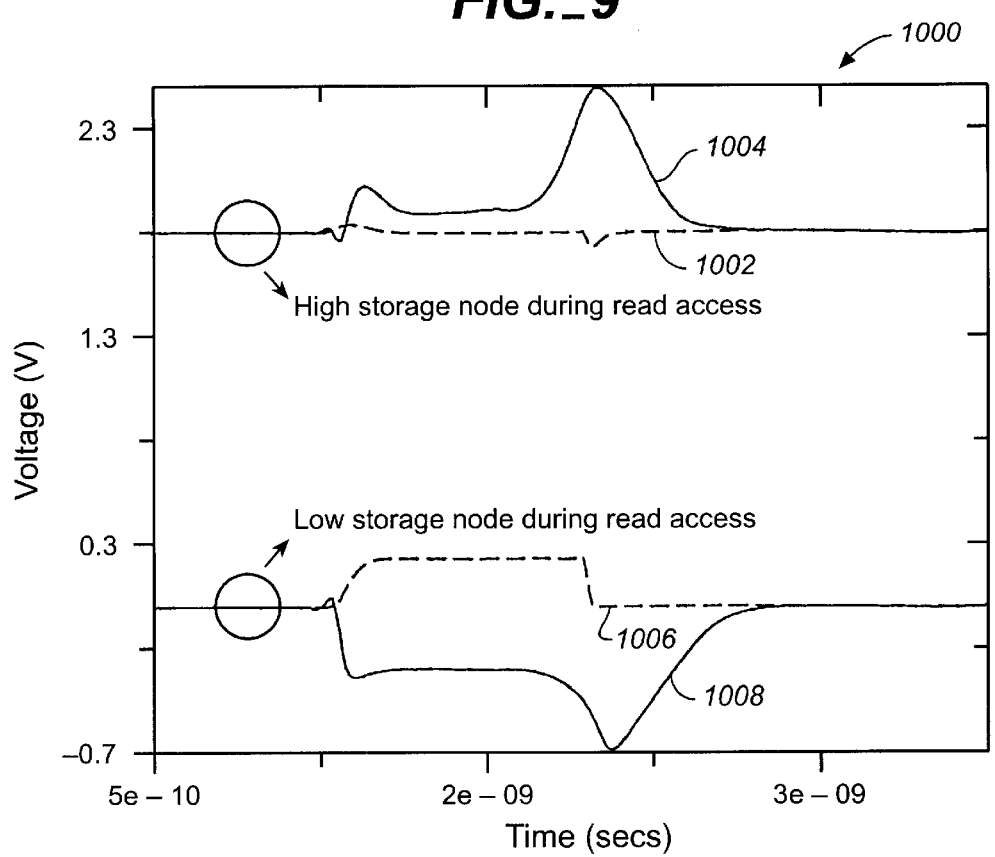
FIG._10

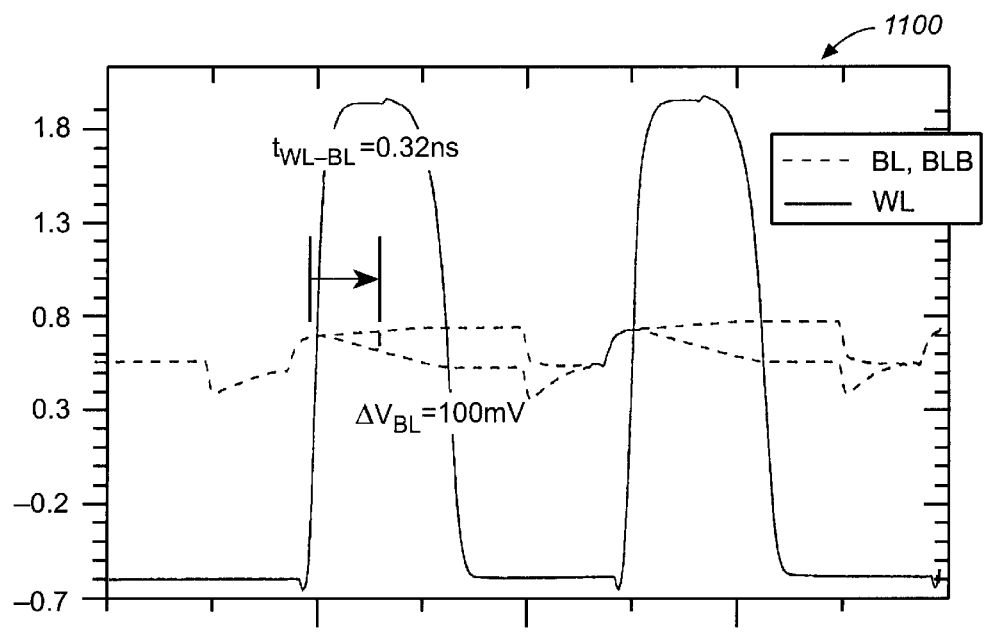
FIG._11
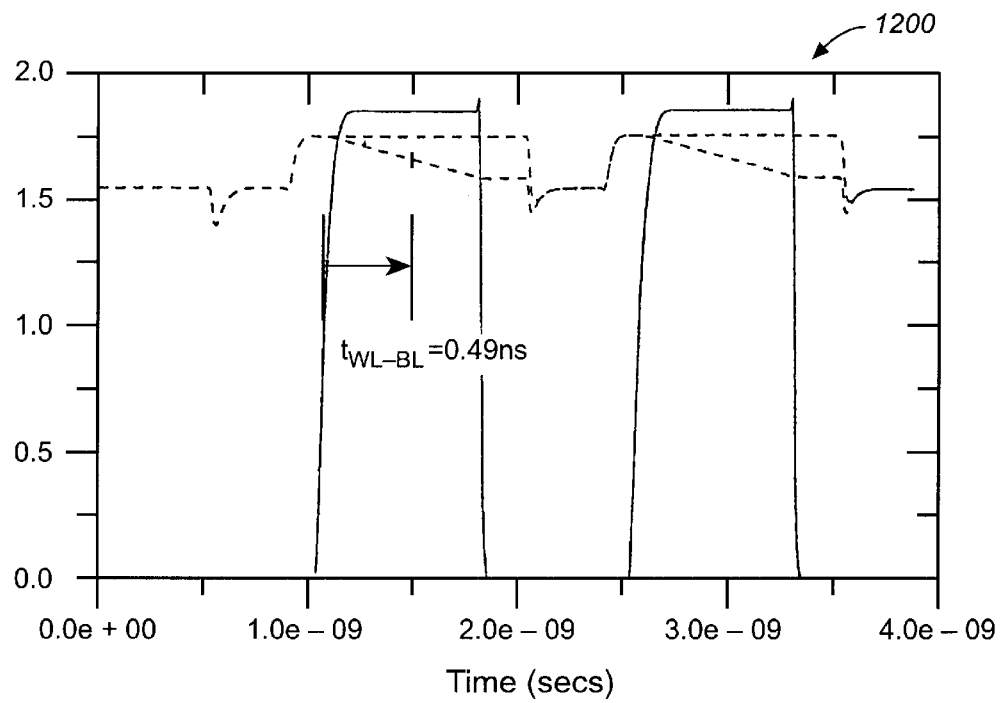
FIG._12

SOURCE PULSED, LOW VOLTAGE CMOS SRAM CELL FOR FAST, STABLE OPERATION

BACKGROUND OF THE INVENTION

The present invention relates generally to random access memory (RAM) circuits. More specifically, but without limitation thereto, the present invention relates to a complementary metal-oxide semiconductor (CMOS) static random access memory (SRAM) cell in which the high storage node is driven above the voltage rail and the low storage node is driven below the ground rail during a read access.

In a conventional CMOS SRAM cell, microscopic intrinsic fluctuations in the channel region of minimum geometry cell MOSFETs become more pronounced for device generations below 130 nm. Macroscopic extrinsic variations in the cell due to process variations across chip, wafer and dice coupled with temperature and Vdd variations make the cell increasingly unstable with scaling. The higher cell instability that accompanies scaling requires larger beta ratios, which results in a larger cell, array, and chip area and consequently higher chip and system cost.

With down-scaling of device threshold voltages, increases in SRAM array size and percentage of chip transistors dedicated to SRAM, the total subthreshold leakage current from cell transistors increases, significantly increasing standby power dissipation from the SRAM array compared to peripheral circuitry and random logic cores. The increased standby power dissipation of the SRAM array imposes increasingly severe constraints on battery life and the size of portable equipment using conventional SRAM cells.

As SRAM array size increases, SRAM cell delay tends to improve less rapidly than logic gate delay. Higher cell drive may be achieved by boosting the word line voltage during cell access, but the resulting increase in cell drive is only marginal.

SUMMARY OF THE INVENTION

The present invention advantageously addresses the problems above as well as other problems by providing a source pulsed complementary metal oxide semiconductor static random access memory with higher cell stability, lower bit line delay, and lower standby power than previously available in low-voltage devices.

In one embodiment, the present invention may be characterized as a memory cell that includes a first pull-up device, a first pull-down device connected to the first pull-up device, a first cell access device connected to the first pull-down device, a second pull-up device connected to the first pull-up device, a second pull-down device connected to the second pull-up device, and a second cell access device connected to the second pull-down device wherein the first cell access device and the second cell access device are connected to a word line that is driven to a voltage that is less than Vss in standby mode and is pulsed to Vdd during read access.

BRIEF DESCRIPTION OF THE DRAWINGS

The above and other aspects, features and advantages of the present invention will be more apparent from the following more specific description thereof, presented in conjunction with the following drawings wherein:

FIG. 1 is a schematic diagram of a conventional complementary metal oxide semiconductor static random access memory cell of the prior art;

FIG. 2 is a schematic diagram illustrating sub-threshold leakage paths of the conventional memory cell of FIG. 1 during standby mode;

FIG. 3 is a schematic diagram of a source pulsed complementary metal oxide semiconductor static random access memory cell (SP-CMOS SRAM) according to an embodiment of the present invention;

FIG. 4 is a graph of voltage vs. time for the word line, the source line, and the power line of the SPCMOS SRAM of FIG. 3;

FIG. 5 is a schematic diagram of a source line driver for the SP-CMOS SRAM of FIG. 3;

FIG. 6 is a schematic diagram of a word line driver for the SP-CMOS SRAM of FIG. 3;

FIG. 7 is a schematic diagram of a power line driver for the SP-CMOS SRAM of FIG. 3;

FIG. 8 is a graph from an HSPICE simulation comparing cell charging and discharging bit line read current of a conventional memory cell and the SP-CMOS SRAM of FIG. 3;

FIG. 9 is a graph from an HSPICE simulation of voltage waveforms of the power line, the word line, and the source line for the SP-CMOS SRAM of FIG. 3;

FIG. 10 is a graph from an HSPICE simulation comparing cell storage node voltage for a conventional memory cell and the SP-CMOS SRAM of FIG. 3;

FIG. 11 is a graph from an HSPICE simulation of bit line response for the SP-CMOS SRAM of FIG. 3; and FIG. 12 is a graph from an HSPICE simulation of bit line response for a conventional memory cell.

Corresponding reference characters indicate corresponding elements throughout the several views of the drawings.

DETAILED DESCRIPTION OF THE DRAWINGS

The following description is presented to disclose the currently known best mode for making and using the present invention. The scope of the invention is defined by the claims.

FIG. 1 is a schematic diagram of a conventional complementary metal oxide semiconductor static random access memory cell 100 of the prior art. Shown in FIG. 1 are pull-down NFETs 102, pull-up inverter PFETs 104, cell access NFETs 106, bit lines 108, a left storage node 110, and a right storage node 112.

Each pull-down NFET 102 is connected in series with a pull-up inverter PFET 104. The junction of the drains of each pull-down NFET 102 and each pull-up inverter PFET 104 forms the left storage node 110 and the right storage node 112 respectively. The drains of the cell access NFETs 106 are connected to the left storage node 110 and the right storage node 112 respectively.

In operation, the gates of the cell access NFETs 106 are driven to Vdd during cell access. The source terminals of the cell access NFETs 106 are connected to the pair of bit lines 108, which are typically precharged to Vdd. In standby mode, the sources of the cell access NFETs 106 connected to the bit lines 108 have a voltage of less than Vdd, and the gates of the cell access NFETs 106 are driven to Vss. Vss is typically ground (Gnd) or zero volts, but Vss may also be a negative voltage in specific applications.

FIG. 2 is a schematic diagram 200 illustrating sub-threshold leakage paths 202 of the conventional memory cell 100 of FIG. 1 in standby mode. In standby mode, the bit line voltage at the sources of the cell access NFETs 106 may drop below Vdd. As a result, four of the six cell FETs 102, 104, and 106 dissipate power via the sub-threshold leakage paths 202. The standby current through the sub-threshold leakage paths 202 for a large cell array may significantly shorten available operating time from a portable power source.

FIG. 3 is a schematic diagram of a source pulsed complementary metal oxide semiconductor static random access memory cell (SP-CMOS SRAM) 300. Shown in FIG. 3 are pull-down devices 302, pull-down device body 304, pull-up devices 306, pull-up device body 308, cell access devices 310, bit lines 312, a left storage node 314, a right storage node 316, a power line 318, a word line 320, and a source line 322.

The pull-down devices 302 may be, for example, NFETs having a terminal connection to the body for connecting to Vss. The pull-up devices 306 may be, for example, inverter PFETs having a terminal connection to the body for connecting to Vdd. The cell access devices 310 may be NFETs similar to those of the conventional memory cell 100 in FIG. 1. In contrast to the conventional memory cell 100, the body terminals of the pull-down devices 302 are connected to Vss and the body of the pull-up devices 306 is connected to Vdd. In this arrangement, the body-source junction is forward-biased during read access to further increase read current. The forward bias voltage is limited to the voltage drop of the source-body p-n junction, about 600 mv, to avoid significant forward diode leakage current.

The source of each of the pull-up devices 306 is connected to the power line 318. In the conventional memory cell 100, the sources of the pull-up inverter PFETs are simply connected to Vdd. In contrast to the conventional memory cell 100, the SP-CMOS SRAM 300 pulses the power line 318 to $(1+\gamma)$Vdd during a read access, where $\gamma \approx 0.6$ volts/Vdd. For example, if Vdd is 1.2 volts and Vss is Gnd, $\gamma = \frac{1}{2}$. If Vdd is 1.8 volts and Vss is Gnd, $\gamma = \frac{1}{3}$.

Likewise, the source of each of the pull-down devices 306 is connected to the source line 322. In the conventional memory cell 100, the sources are simply connected to Vss. In contrast to the conventional memory cell 100, the SP-CMOS SRAM 300 pulses the source line 322 to Vss–$\gamma$Vdd. The pulsing of the power line 318 and the source line 322 will be explained in greater detail below.

The drain of each of the pull-up devices 306 is connected in series with the drain of one of the pull-down devices 302 to form a storage node driver. The common drain connections form the storage nodes 314 and 316, respectively. Each of the storage nodes 314 and 316 is connected to the two gates of the pull-up device 306 and the pull-down device 302 of the opposite storage node driver. The storage nodes 314 and 316 are also each connected in series with the bit lines 312 by the cell access devices 310, respectively.

The ratio of the channel widths of the NFETs used for the pull-down devices 302 and that of the cell access NFETs 310 is called the cell ratio or the beta ratio. The cell ratio determines how high the '0' storage node rises during a read access. Smaller cell ratios result in a greater voltage drop across the pull-down devices 302, allowing a smaller noise voltage at the '0' storage node to trigger the cell. Smaller cell ratios thus result in a reduced noise margin.

In practice, driving the source terminals of the pull-up devices 306 above Vdd by a marginal voltage difference $\gamma$Vdd results in a substantial increase in cell read current due to the advantageous combination of the following factors: (1) an increase in gate-source voltage, (2) an increase in drain-source voltage, and (3) a reduction in the device threshold voltage due to forward bias on the source-body p-n junctions of the pull-up devices 306.

The series-connected cell access devices 310 also drive more current, because the storage nodes 314 and 316 are driven respectively below Vss and above Vdd, thus boosting the gate-source, drain-source, and source-body voltages of the cell access devices 310.

Likewise, driving the source terminals of the pull-down devices 302 below Vss ensures enough margin for the voltage drop across the pull-down devices 302 so that the '0' storage node does not rise above ground during read access.

A distinctive feature of the SP-CMOS SRAM 300 is that the threshold voltage implant dose is blocked from the cell access devices 310 during the implantation process, resulting in a zero threshold voltage. Because the cell access devices 310 have a large negative gate-source voltage applied during standby mode, a threshold voltage of zero does not adversely affect sub-threshold leakage from the cell access devices 310. Also, by blocking threshold voltage implants, cell read current may be higher, while intrinsic fluctuations of threshold voltage due to higher dopant concentrations from threshold voltage implanting are lowered significantly.

Another distinctive feature of the SP-CMOS SRAM 300 is that the word line 320 is maintained at Vss–$\gamma$Vdd except during cell access, when the word driver line 320 is pulsed to Vdd. As a result, the threshold leakage currents through the cell access devices 310 from two of the four sub-threshold leakage paths 202 shown in FIG. 2 are completely cut off in the standby mode, reducing the standby leakage current by 50 percent compared to a conventional memory cell having identical geometry.

In the conventional memory cell 100, the bit lines 108 are precharged high to Vdd. This is because the cell drive current required to discharge the bit lines 108 is much higher from the pull-down devices 102 through the cell access devices 106 than in the corresponding case when the bit lines 108 are precharged low. When the bit lines 108 are precharged low, the bit lines 108 are charged from the pull-up devices 104 through the cell access devices 106 to sense cell data.

In contrast to the conventional memory cell 100, the source terminals of the pull-up devices 306 are boosted beyond the Vdd-Vss range during read access and the bit line precharge voltage is lowered, increasing the potential difference between the sources of the pull-up devices 306 and the bit lines 312. One of the bit lines 312 is driven to a voltage higher than the precharge voltage, for example, Vdd, while the discharge path drives the other bit line 312 to a voltage lower than the precharge voltage, for example, Vss. As a result, the bit line response and corresponding cell speed are improved. Pulsing the source terminals of the pull-up devices 306 above Vdd from the power line 318 during read access ensures enough margin for voltage drop across the pullup devices 306 when the bit lines 312 are precharged to a low, non-zero voltage, for example, Vdd/3. Reducing the precharge voltage to Vdd/3 also reduces the precharge energy by 88%.

Because the power line 318, the word driver line 320, and the source line 322 are pulsed at transitions of the word line (WL) during read access, drivers are used to sense the word line transitions and to pulse the word driver line 320 during cell access (read and write) and to pulse the source line 322 below Vss and the power line 318 above Vdd during read access.

FIG. 4 is a graph 400 of voltage vs. time for the power line 318, the word driver line 320, and the source line 322 of the source pulsed complementary metal oxide semiconductor static random access memory cell (SP-CMOS SRAM) 300 of FIG. 3.

The voltage of the word driver line 320 is maintained at Vss−γVdd in standby mode and pulsed to Vdd during cell access (read and write). The voltage of the source line 322 is maintained at Vss except during read access, when it is pulsed to Vss−γVdd. The voltage of the power line 318 is maintained at Vdd except during read access, when it is pulsed to (1+γ)Vdd.

FIG. 5 is a schematic diagram of a source line driver 500 for the SP-CMOS SRAM 300. Shown in FIG. 5 are a NAND gate 502, NFETs 504, 506, 508, 510, and 512, and inverter PFETs 514 and 516.

In standby mode, the word line input is low and the output of the NAND gate 502 is high. NFETs 504, 508, and 510 are on, and NFETs 506 and 512 are off. PFET 514 is off and PFET 516 is on, driving source line 322 at Vss, which is Gnd in this example.

During read access, the word line input is high and the output of the NAND gate 502 is low. NFETs 504 and 508 are partially on, NFET 510 is off, PFET 514 is on, PFET 516 is off, and NFETs 506 and 512 are on, driving the source line 322 to −γVdd.

FIG. 6 is a schematic diagram of a word line driver 600 for the SP-CMOS SRAM 300. Shown in FIG. 6 are an inverter 602, NFETs 604, 606, 608, and 610, and a PFET 612.

In standby mode, the word line input is low and the output of the inverter 602 is high. NFETs 604, 608, and 610 are on, and NFET 606 and PFET 612 are off, maintaining the word line 320 at −γVdd.

During cell access (read/write access), the word line input is high and the output of the inverter 602 is low. NFETs 604 and 608 are partially on, NFET 610 is off, and NFET 606 and PFET 612 are on, driving the word line 320 to Vdd.

FIG. 7 is a schematic diagram of a power line driver 700 for the SP-CMOS SRAM 300. Shown in FIG. 7 are a NAND gate 702, an inverter 704, inverter PFETs 706, 708, 710, and 712, and NFETs 714, 716, and 718.

In standby mode, the word line input is low, the output of the NAND gate 702 is high, and the output of the inverter 704 is low. The PFETs 708 and 712 are off, the PFETs 706 and 710 are on, the NFETs 714 and 716 are off, and the NFET 718 is on, maintaining the power line 318 at Vdd.

During read access, the word line input is high, the output of the NAND gate 702 is low, and the output of the inverter 704 is high. The PFETs 706 and 710 and the NFET 718 are off, and the PFETs 708 and 712 are on, driving the power line 318 to (1+γ)Vdd.

FIG. 8 is a graph 800 from an HSPICE simulation comparing cell charging and discharging bit line read current for a conventional memory cell and the SP-CMOS SRAM 300. The dashed curves represent the bit line charge and discharge cell read currents for the conventional memory cell, and the solid curves represent the bit line charge and discharge currents for the SP-CMOS SRAM 300. As may be appreciated from the graph 800, the cell read current is significantly greater for the SP-CMOS SRAM 300 than for the conventional memory cell.

FIG. 9 is a graph 900 from an HSPICE simulation of voltage waveforms of the power line (PL) 318, the word line (WL) 320, and the source line (SL) 322 for the SP-CMOS SRAM 300. The voltage waveforms are similar to the ideal voltage waveforms in the graph 400 of FIG. 4.

FIG. 10 is a graph 1000 from an HSPICE simulation comparing cell storage node voltage for a conventional memory cell and the SP-CMOS SRAM 300. The dashed curves 1002 and 1006 represent the cell storage node voltage for the conventional memory cell, and the solid curves 1004 and 1008 represent the cell storage node voltage for the SP-CMOS SRAM 300. In the SP-CMOS SRAM 300, the high storage node is driven above Vdd and the low storage node is driven below Vss, significantly increasing the noise margin compared to that of the conventional memory cell.

FIG. 11 is a graph 1100 from an HSPICE simulation of bit line voltage response for the SP-CMOS SRAM 300. The bit line voltage response (dashed lines) in this example is 0.32 ns for a bit line voltage drop of 100 millivolts.

FIG. 12 is a graph 1200 from an HSPICE simulation of bit line voltage response for a conventional memory cell. Although the cell geometry of the conventional memory cell 100 is the same as that of the SP-CMOS SRAM 300, the bit line response (dashed lines) is 0.49 ns, about 50 percent more than the bit line voltage response of the SP-CMOS SRAM 300.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A memory cell comprising:
    a first pull-up device;
    a first pull-down device connected to the first pull-up device;
    a first cell access device connected to the first pull-down device;
    a second pull-up device connected to the first pull-up device;
    a second pull-down device connected to the second pull-up device;
    a second cell access device connected to the second pull-down device,
    wherein the first cell access device and the second cell access device are connected to a word line driven by a voltage that is less than Vss in standby mode and is equal to Vdd during read/write access; and
    a pulsed source line driver connected to the first pull-down device and the second pull-down device for generating a voltage that is substantially equal to Vss except during read access and is less than Vss during read access,
    wherein the voltage generated by the pulsed source line driver during read access is Vss−γVdd,
    wherein γVdd is less than or equal to a voltage across a forward-biased source-body junction of one of the first cell access device and the second cell access device, and
    wherein Vdd is greater than 1.2 volts, γ is ⅓, and Vss is substantially equal to Gnd.

2. A memory cell comprising:
    a first pull-up device;
    a first pull-down device connected to the first pull-up device;
    a first cell access device connected to the first pull-down device;

a second pull-up device connected to the first pull-up device;

a second pull-down device connected to the second pull-up device;

a second cell access device connected to the second pull-down device, wherein the first cell access device and the second cell access device are connected to a word line driven by a voltage that is less than Vss in standby mode and is equal to Vdd during read/write access; and a pulsed power line driver connected to the first pull-up device and the second pull-up device for generating a voltage that is substantially equal to Vdd except during read access and that is greater than Vdd during read access wherein:

the voltage generated by the pulsed power line driver during read access is $(1+\gamma)$Vdd, and $\gamma$Vdd is less than or equal to a voltage across a forward-biased source-body junction of one of the first cell access device and the second cell access device.

3. The memory cell of claim 2 wherein $\gamma$ is substantially equal to $\frac{1}{3}$, Vss is substantially equal to Gnd, and Vdd is greater than 1.2 volts.

4. The memory cell of claim 2 wherein $\gamma$ is substantially equal to $\frac{1}{2}$, Vss is substantially equal to Gnd, and Vdd is less than or equal to 1.2 volts.

5. A memory cell comprising:

a first pull-up device;

a first pull-down device connected to the first pull-up device;

a first cell access device connected to the first pull-down device;

a second pull-up device connected to the first pull-up device;

a second pull-down device connected to the second pull-up device;

a second cell access device connected to the second pull-down device, wherein the first cell access device and the second cell access device are connected to a word line driven by a voltage that is less than Vss in standby mode and is equal to Vdd during read/write access; and a pulsed word line driver connected to the word line wherein the pulsed word line driver generates a voltage substantially equal to Vss–$\gamma$Vdd in standby mode wherein $\gamma$Vdd is less than or equal to a voltage across a forward-biased source-body junction of one of the first cell access device and the second cell access device.

6. The memory cell of claim 5 wherein $\gamma$ is substantially equal to $\frac{1}{3}$, Vss is substantially equal to Gnd, and Vdd is greater than 1.2 volts.

7. The memory cell of claim 5 wherein $\gamma$ is substantially equal to $\frac{1}{2}$, Vss is substantially equal to Gnd, and Vdd is less than or equal to 1.2 volts.

8. A memory cell comprising:

a first pull-up device;

a first pull-down device connected to the first pull-up device;

a first cell access device connected to the first pull-down device;

a second pull-up device connected to the first pull-up device;

a second pull-down device connected to the second pull-up device;

a second cell access device connected to the second pull-down device, wherein:

the first cell access device and the second cell access device are connected to a word line driven by a voltage that is less than Vss in standby mode and is equal to Vdd during read/write access, and the first cell access device and the second cell access device each have a gate threshold voltage that is substantially zero;

a pulsed source line driver connected to the first pull-down device and the second pull-down device for generating a voltage that is substantially equal to Vss except during read access and is less than Vss during read access;

a pulsed power line driver connected to the first pull-up device and the second pull-up device for generating a voltage that is substantially equal to Vdd except during read access and that is greater than Vdd during read access;

a pulsed word line driver connected to the word line wherein the pulsed word line driver generates a voltage substantially equal to Vss–$\gamma$Vdd in standby mode wherein $\gamma$Vdd is less than or equal to a voltage across a forward-biased source-body junction of one of the first cell access device and the second cell access device;

a first bit line connected to the first cell access device; and a second bit line connected to the second cell access device wherein the first bit line is driven to a voltage that is greater than the precharge voltage and the second bit line is driven to a voltage that is less than the precharge voltage during read access.

* * * * *